(12) United States Patent
Wei et al.

(10) Patent No.: US 11,322,463 B2
(45) Date of Patent: May 3, 2022

(54) PACKAGED CIRCUIT STRUCTURE INCLUDING CIRCUIT STRUCTURE WITH ANTENNA AND METHOD FOR MANUFACTURING THE SAME

(71) Applicants: Avary Holding (Shenzhen) Co., Limited., Shenzhen (CN); QING DING PRECISION ELECTRONICS (HUAIAN) CO., LTD, Huai an (CN)

(72) Inventors: Yong-Chao Wei, Qinhuangdao (CN); Jia-He Li, Shenzhen (CN)

(73) Assignees: Avary Holding (Shenzhen) Co., Limited., Shenzhen (CN); QING DING PRECISION ELECTRONICS (HUAIAN) CO., LTD, Huai an (CN)

( * ) Notice: Subject to any disclaimer, the term of this patent is extended or adjusted under 35 U.S.C. 154(b) by 0 days.

(21) Appl. No.: 17/030,528

(22) Filed: Sep. 24, 2020

(65) Prior Publication Data

US 2022/0084963 A1 Mar. 17, 2022

(30) Foreign Application Priority Data

Sep. 16, 2020 (CN) .......................... 202010975787.9

(51) Int. Cl.
*H01L 23/552* (2006.01)
*H01L 23/66* (2006.01)
(Continued)

(52) U.S. Cl.
CPC .......... *H01L 23/66* (2013.01); *H01L 21/4882* (2013.01); *H01L 23/552* (2013.01);
(Continued)

(58) Field of Classification Search
CPC ... H01L 23/66; H01L 21/4882; H01L 23/552; H01L 24/29; H01L 24/83; H01L 2223/6677
(Continued)

(56) References Cited

U.S. PATENT DOCUMENTS

| 2010/0078205 A1* | 4/2010 | Sakai | H05K 1/185 174/260 |
| 2011/0175213 A1* | 7/2011 | Mori | H01L 23/13 257/675 |
| 2012/0241205 A1* | 9/2012 | Shimizu | H01L 24/19 174/260 |

FOREIGN PATENT DOCUMENTS

| CN | 107946249 A | 4/2018 |
| TW | 201926625 A | 7/2019 |

* cited by examiner

*Primary Examiner* — Didarul A Mazumder
(74) *Attorney, Agent, or Firm* — ScienBiziP, P.C.

(57) ABSTRACT

A packaged antenna circuit structure suitable for 5G use includes a shielding layer, an electronic component, conductive pillars, a first insulation layer, a first stacked structure, an antenna structure, and a second stacked structure. The shielding layer defines a groove to receive the electronic component. The conductive pillars on the shielding layer surround the groove. The first insulation layer covers the shielding layer, the electronic component, and the conductive pillars. The first stacked structure is stacked on a side of the first insulation layer and includes a ground line connecting to the conductive pillars. The antenna structure is stacked on a side of the first stacked structure away from the first insulation layer and connected to the electronic component by the first stacked structure. The second stacked structure is stacked on a side of the first insulation layer away from the first stacked structure.

7 Claims, 6 Drawing Sheets

(51) Int. Cl.
  *H01L 23/00* (2006.01)
  *H01L 21/48* (2006.01)
(52) U.S. Cl.
  CPC .............. *H01L 24/29* (2013.01); *H01L 24/83* (2013.01); *H01L 2223/6677* (2013.01)
(58) Field of Classification Search
  USPC ........................................................ 257/659
  See application file for complete search history.

PACKAGED CIRCUIT STRUCTURE INCLUDING CIRCUIT STRUCTURE WITH ANTENNA AND METHOD FOR MANUFACTURING THE SAME

FIELD

The subject matter herein generally relates to a packaged circuit structure and a method for manufacturing same, particularly relates to a circuit structure with antenna.

BACKGROUND

The 5th generation wireless standard requires more components to be integrated into the antenna module. Current levels of electromagnetic interference between components and heat produced will be very destructive unless the antenna module is improved.

Therefore, there is room for improvement within the art.

BRIEF DESCRIPTION OF THE DRAWINGS

Implementations of the present disclosure will now be described, by way of embodiments, with reference to the attached figures.

DETAILED DESCRIPTION

Figure 1:
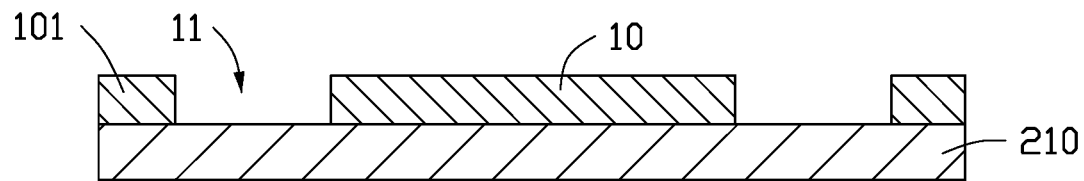
FIG. 1 is a cross-sectional view of an embodiment of a metal layer.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

FIGS. 1 to 16 illustrate a method for manufacturing a packaged circuit structure in accordance with an embodiment. The method includes the following steps S1 to S8.

In step S1, referring to FIG. 1, a shielding layer 10 is provided.

Specifically, step S1 includes providing a supporting plate 210, forming a metal layer 101 on the supporting plate 210, and forming a plurality of through holes 11 on the metal layer 101 to divide the metal layer 101 into a plurality of shielding layers 10. A release film (not shown) may be formed between the supporting plate 210 and the metal layer 101, which facilitates separation of the metal layer 101 from supporting plate 210.

The material of the supporting plate 210 may be, but is not limited to, metal or glass. The material of the metal layer 101 may be, but is not limited to, copper, silver, or alloys thereof.

Figure 2:
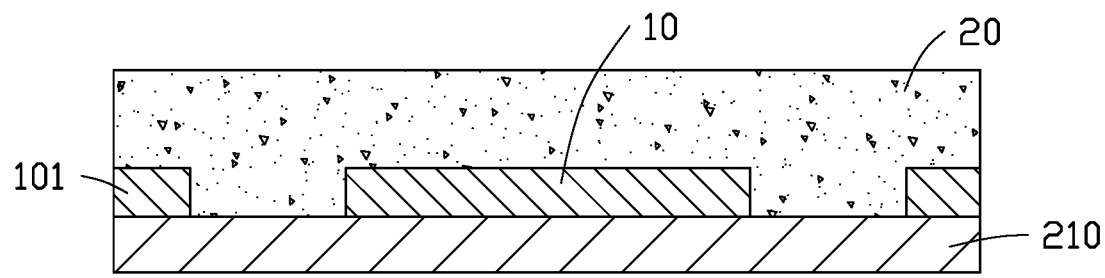
FIG. 2 is a cross-sectional view showing a first insulation layer pressed onto a side of the metal layer of FIG. 1.
Figure 3:
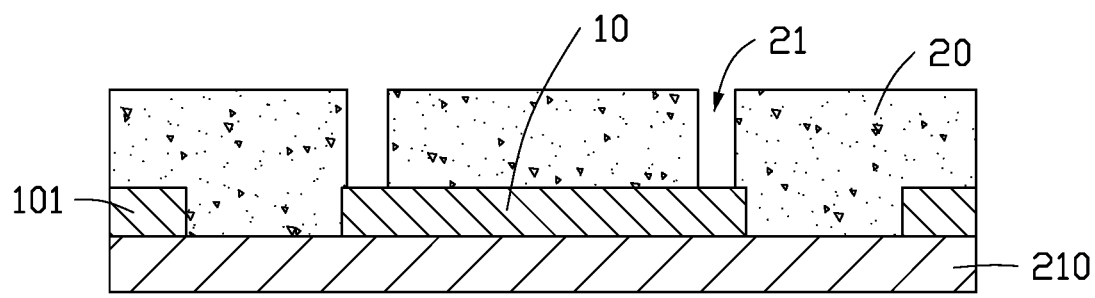
FIG. 3 is a cross-sectional view showing a plurality of through holes formed on the first insulation layer of FIG. 2.
Figure 4:
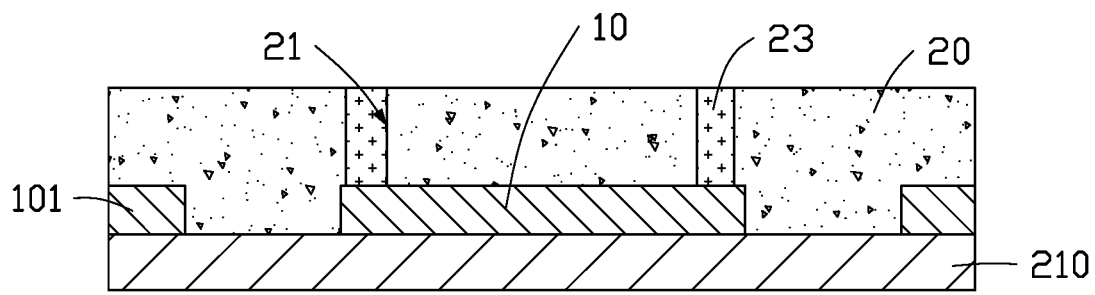
FIG. 4 is cross-sectional view showing conductive pillars formed in the through holes of FIG. 3.

In step S2, referring to FIGS. 2 to 4, a first insulation layer 20 is pressed onto a side of the shielding layer 10, and a plurality of conductive pillars 23 are formed. The first insulation layer 20 covers the shielding layer 20, and one side of the shielding layer 10 is exposed outside the first insulation layer 20. Each of the conductive pillars 23 penetrates the first insulation layer 20 and is electrically connected to the shielding layer 10.

In one embodiment, the first insulation layer 20 infills the through holes 11, and covers sides of the shielding layer 10 which are not in contact with the supporting plate 210. Thereby, a side of the shielding layer 10 in contact with the supporting plate 210 can be exposed outside the first insulation layer 20.

Each of the conductive pillars 23 penetrates a surface of the first insulation layer 20 facing the shielding layer 10 and a surface of the first insulation layer away from the shielding layer 10 and is electrically connected to the shielding layer 10. In one embodiment, the conductive pillars 23 are disposed adjacent to the edges of the shielding layer 10.

Specifically, step S2 includes pressing a first insulation layer 20 onto a side of the metal layer 101 away from the supporting plate 210, forming a plurality of through holes 21 on the first insulation layer 20, and infilling the through holes 21 with conductive materials to form conductive pillars 23. Each of the through holes 21 penetrating a surface of the first insulation layer 20 facing the metal layer 101 and a surface of the first insulation layer away from the metal layer 101. The shielding layer 10 is exposed in the through holes 21. The conductive materials may be, but are not limited to, metal paste or metal powders.

Figure 5:
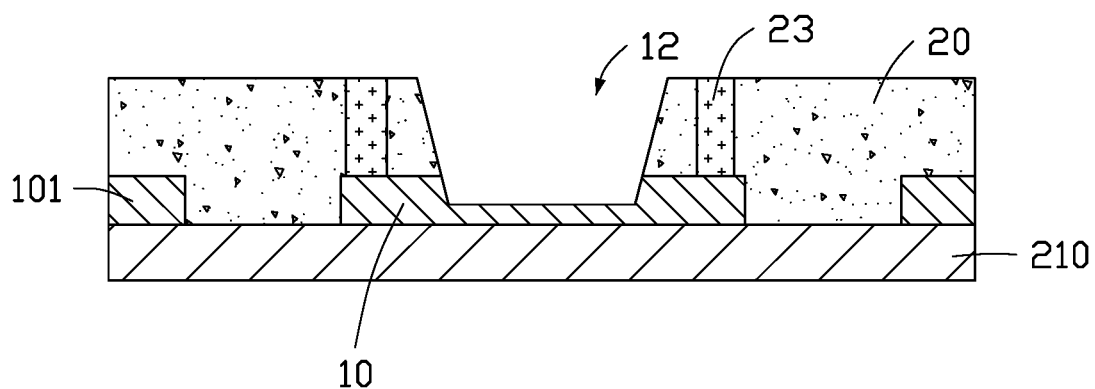
FIG. 5 is a cross-sectional view showing a groove formed on the structure shown in FIG. 4.

In step S3, referring to FIG. 5, a groove 12 is formed on the first insulation layer 20 and the shielding layer 10. The conductive pillars 23 surround the groove 20.

The groove 12 penetrates the surface of the first insulation layer 20 facing the shielding layer 10, the surface of the first insulation layer 20 away from the shielding layer 10, and a surface of the shielding layer 10 away from the supporting plate 210. The groove 12 may be formed by laser cutting, mechanical drilling, or the like.

Figure 6:
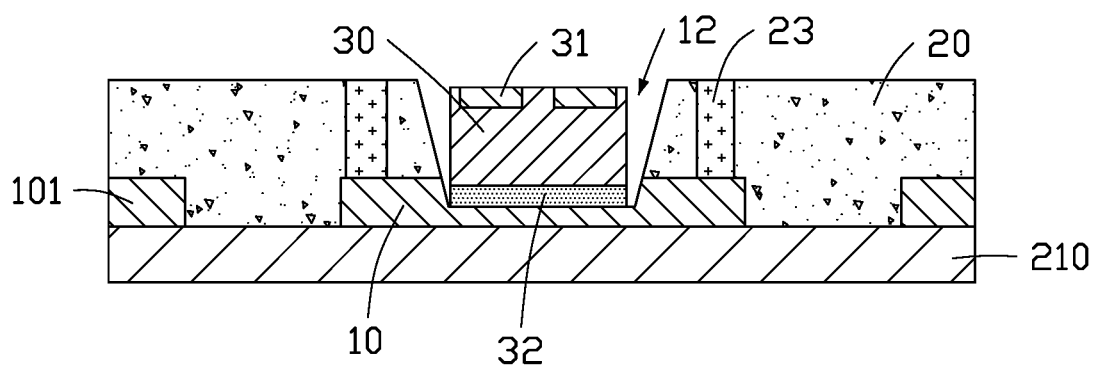
FIG. 6 is a cross-sectional view showing an electronic component fixed in the groove of FIG. 5.

In step S4, referring to FIG. 6, an electronic component 30 is provided, and the electronic component 30 is fixed in the groove 12.

In one embodiment, the electronic component 30 is fixed to a bottom of the groove 12 by a thermal conductive adhesive layer 32. The thermal conductive adhesive layer 32 is completely received in the groove 12 on the shielding layer 10. In other words, the thermal conductive adhesive layer 32 does not protrude from the groove on the shielding layer 10. In one embodiment, a thickness of the thermal conductive adhesive layer 32 is less than a depth of the portion of the groove 12 on the shielding layer 10, and the electronic component 30 is partially received in the portion of the groove 12 on the shielding layer 10, which reduces overall thickness. In other embodiments, the electronic component 30 may be fixed in the groove 12 by other methods.

In one embodiment, the thermal conductive adhesive layer 32 has good thermal conductivity to accelerate a heat collection from the electronic component 30, thereby facilitating heat dissipation.

In one embodiment, the electronic component 30 does not protrude from the groove. In an alternative embodiment, a thickness of the electronic component 30 is less than a depth of the groove, preventing risk of crushing the electronic component 30 during the subsequent pressing process.

At least one conductive terminal 31 is formed on a side of the electronic component 30. In one embodiment, the conductive terminal 31 is on a side of the electronic component 30 away from the bottom of the groove 12.

Figure 7:
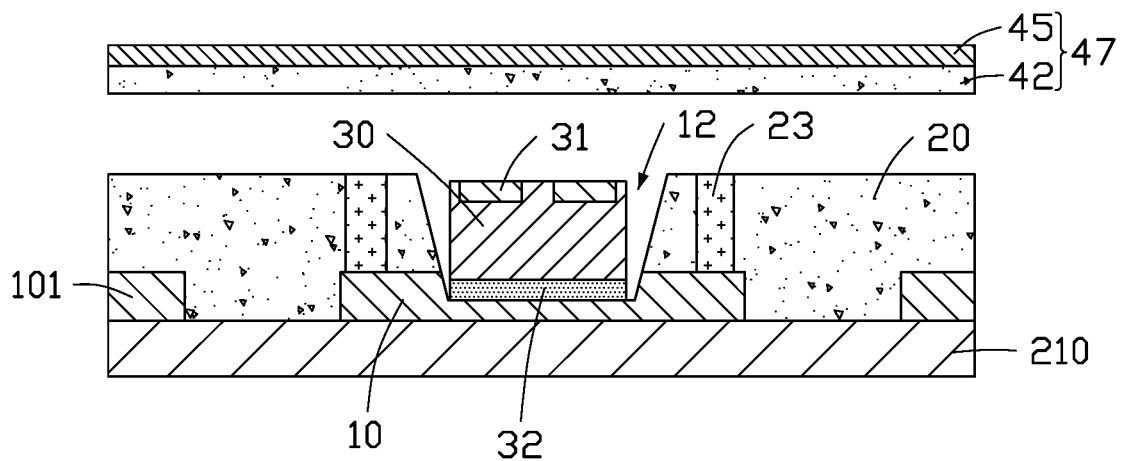
FIG. 7 is a cross-sectional view showing a copper clad laminate provided on a side of the structure shown in FIG. 6.
Figure 8:
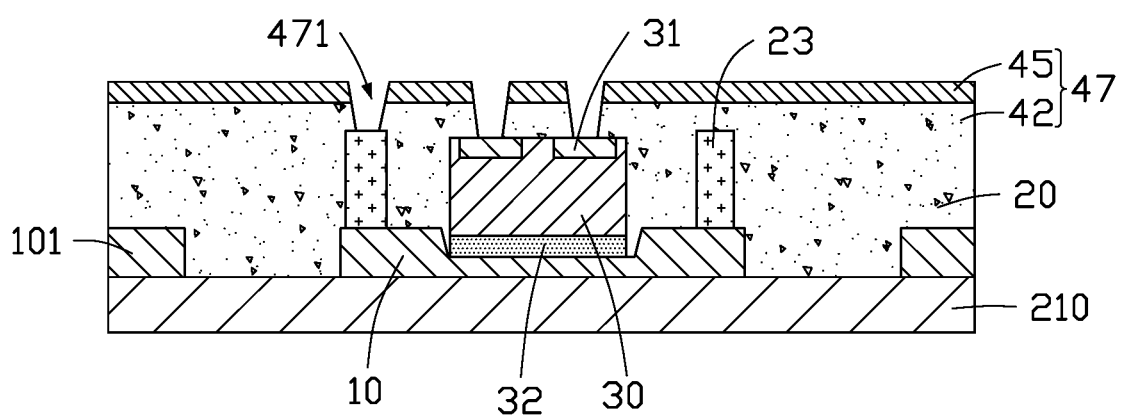
FIG. 8 is a cross-sectional view showing the separate structures shown in FIG. 7 pressed together.
Figure 9:
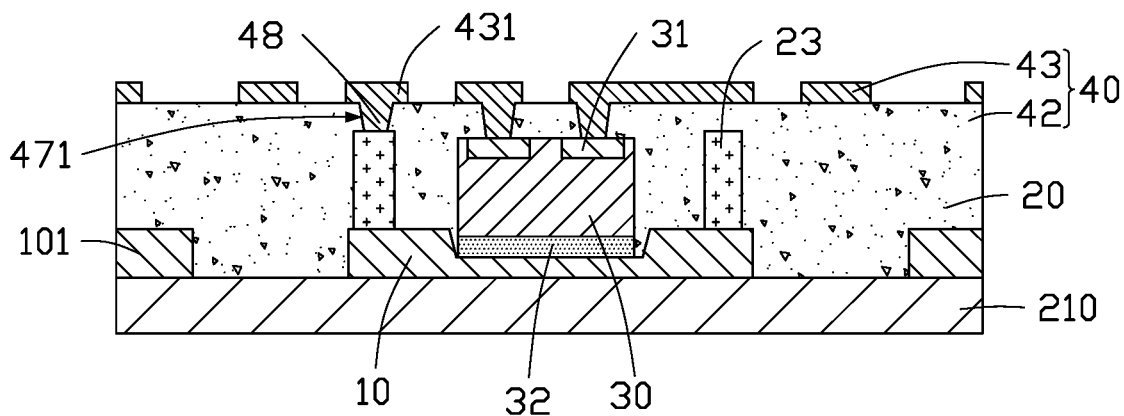
FIG. 9 is a cross-sectional view showing a first conductor layer formed on the structure shown in FIG. 8.

In step S5, referring to FIGS. 7 to 9, a first stacked structure 40 is formed on a same side of the first insulation layer 20 and the electronic component 30, thereby obtaining an electronic component module.

The first stacked structure 40 includes a second insulation layer 42 and a first conductor layer 43 stacked on the second insulation layer 42. The second insulation layer 42 infills the groove 12 and covers the same side of the first insulation layer 20 and the electronic component 30. The second insulation layer 42 is connected to the first insulation layer 20. The first conductor layer 43 is located on a side of the second insulation layer 42 away from the first insulation layer 20 and is electrically connected to the conductive pillars 23 and the electronic component 30. The first conductor layer 43 includes a ground line 431, the ground line 431 is electrically connected to the conductive pillars 23 to form a shielding structure to avoid electromagnetic interference affecting the electronic component 30.

Specifically, step S5 includes providing a copper clad laminate 47 which includes a second insulation layer 42 and a copper layer 45 stacked on the second insulation layer 42. The copper clad laminate 47 is pressed onto a same side of the first insulation layer 20 and the electronic component 30, wherein the second insulation layer 42 infills the groove 12 and is connected to the first insulation layer 20, so that the conductive pillars 23 and the electronic component 30 are embedded into the first insulation layer 20 and the second insulation layer 42. Blind holes 471 are formed on the laminated structure, the conductive pillars 23 and the conductive terminals 31 being exposed in the blind holes 471. The copper layer 45 is patterned to form the first conductor layer 43, and the blind holes 471 are electroplated or infilled with conductive materials to form conductive holes 48. The conductive pillars 23 and the electronic component 30 are electrically connected to the first conductor layer 43 by the conductive holes 48.

In step S6, referring to FIGS. 10 to 14, an antenna structure 50 and a second stacked structure 60 are provided, and the antenna structure 50 and the second stacked structure 60 are respectively laminated on both sides of the electronic component module obtained in step S5, thereby obtaining a packaged circuit structure 100.

The antenna structure 50 corresponds in position to the shielding layer 10 and includes a dielectric layer 51 and an antenna 53 stacked on the dielectric layer 51. The dielectric layer 51 faces the first conductor layer 43. The antenna 53 is located on a side of the dielectric layer 51 away from the first conductor layer 43 and is electrically connected to the first conductor layer 43. The dielectric layer 51 may be, but is not limited to, made of materials having a low dielectric constant, such as modified polyimide, liquid crystal polymer, or polyether ether ketone.

The second stacked structure 60 includes an insulation layer 61 and a second conductor layer 63. The second conductor layer 63 faces the shielding layer 10, and the insulation layer 61 is located on a side of the second conductor layer 63 away from the shielding layer 10. In some embodiments, the second conductor layer 63 includes a plurality of connecting pads 65. The connecting pads 65 are located on a side of the insulation layer 61 away from the second conductor layer 63 to accommodate other electronic elements.

In some embodiments, the antenna structure 50 and the second stacked structure 60 are respectively fixed to both sides of the structure obtained in step S5 by an insulating adhesive layer 70.

In one embodiment, in step S6, the provision of an antenna structure 50 includes the following steps S61 to S62.

Figure 10:
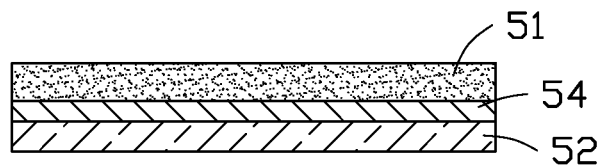
FIG. 10 is a cross-sectional view showing a first metal layer and a dielectric layer formed in order on a protective layer in accordance with an embodiment.

In step S61, referring to FIG. 10, a protective layer 52 is provided, a first metal layer 54 is formed on a surface of the protective layer 52, and a dielectric layer 51 is laminated on the first metal layer 54. The dielectric layer 51 is on a side of the first metal layer 54 away from the protective layer 52.

Figure 11:
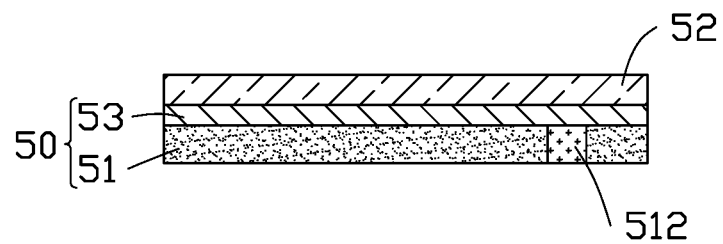
FIG. 11 is a cross-sectional view showing a first conductive hole formed on the dielectric layer of FIG. 10.

In step S62, referring to FIG. 11, a first conductive hole 512 is formed on the dielectric layer 51, the first conductive hole 512 penetrates the dielectric layer 51 and is electrically connected to the first metal layer 54, thereby obtaining the antenna structure 50. In one embodiment, the first metal layer 54 functions as the antenna 53. Specifically, step S62 includes forming a through hole (not shown) passing through the dielectric layer 51 and infilling that through hole with conductive materials to form the first conductive hole 512.

In one embodiment, in step S6, the provision of a second stacked structure 60 includes the following steps S63 to S64.

Figure 12:
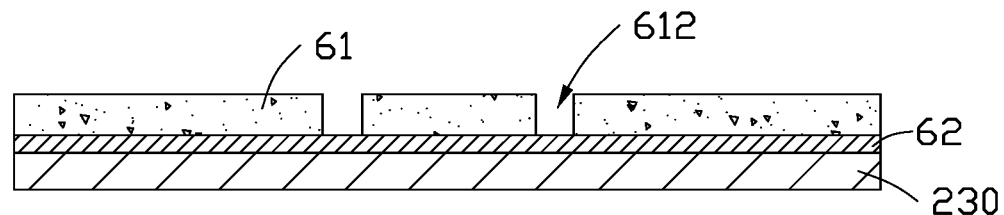
FIG. 12 is a cross-sectional view showing a second layer and an insulation layer formed on a supporting plate in accordance with an embodiment.

In step S63, referring to FIG. 12, a supporting plate 230 is provided, and a second metal layer 62 and an insulation layer 61 are formed in order on a side of the supporting plate 230, and a plurality of through holes 612 are formed on the insulation layer 61. The insulation layer 61 is located on a side of the second metal layer 62 away from the supporting plate 230. In one embodiment, the insulation layer 61 is laminated on the second metal layer 62.

Figure 13:
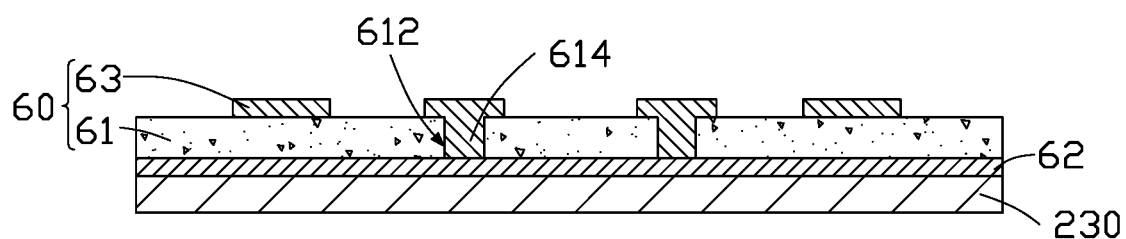
FIG. 13 is a cross-sectional view showing a second conductor layer formed on the insulation layer of FIG. 12.

In step S64, referring to FIG. 13, the through holes 612 are infilled to form second conductive holes 614, and a second conductor layer 63 is formed on a side of the insulation layer 61 away from the second metal layer 62. The second conductor layer 63 is electrically connected to the second metal layer 62 by the second conductive holes 614.

In one embodiment, in step S6, the lamination of the antenna structure 50 and the second stacked structure 60 on both sides of the structure obtained in step S5 includes the following steps S65 to S67.

Figure 14:
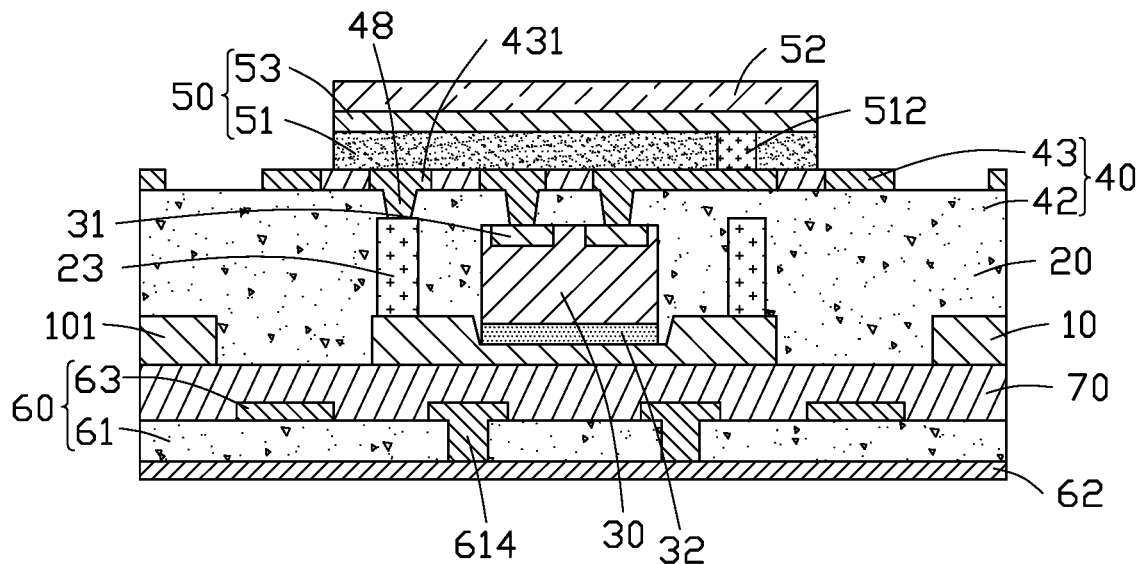
FIG. 14 is a cross-sectional view showing the structure shown in FIG. 11 and the structure shown in FIG. 13 pressed onto opposite surfaces of the structure shown in FIG. 9.

In step S65, referring to FIG. 14, after laminating an insulating adhesive layer 70 on a side of the first conductor layer 43 away from the second insulation layer 42, the antenna structure 50 is laminated on the first conductor layer 43. The antenna structure 50 is fixed on the first stacked structure 40 by the insulating adhesive layer 70. In one embodiment, the insulating adhesive layer 70 infills gaps in the first conductor layer 43, thus a surface of the insulating adhesive layer 70 away from the second insulation layer 42 is flush with a surface of the first conductor layer 43 away from the second insulation layer 42. The first conductive hole 512 of the antenna structure 50 is electrically connected to the first conductor layer 43.

In step S66, referring to FIG. 4, the supporting plate 210 is removed, and an insulating adhesive layer 70 and the second stacked structure 60 are laminated in order on a same side of the first insulation layer 20 and the shielding layer 10. The second stacked structure 60 is fixed on the first insulation layer 20 by the insulating adhesive layer 70. The second conductor layer 63 faces the first insulation layer 20.

In some embodiments, the method for manufacturing a packaged circuit structure further includes step S7.

Figure 15:
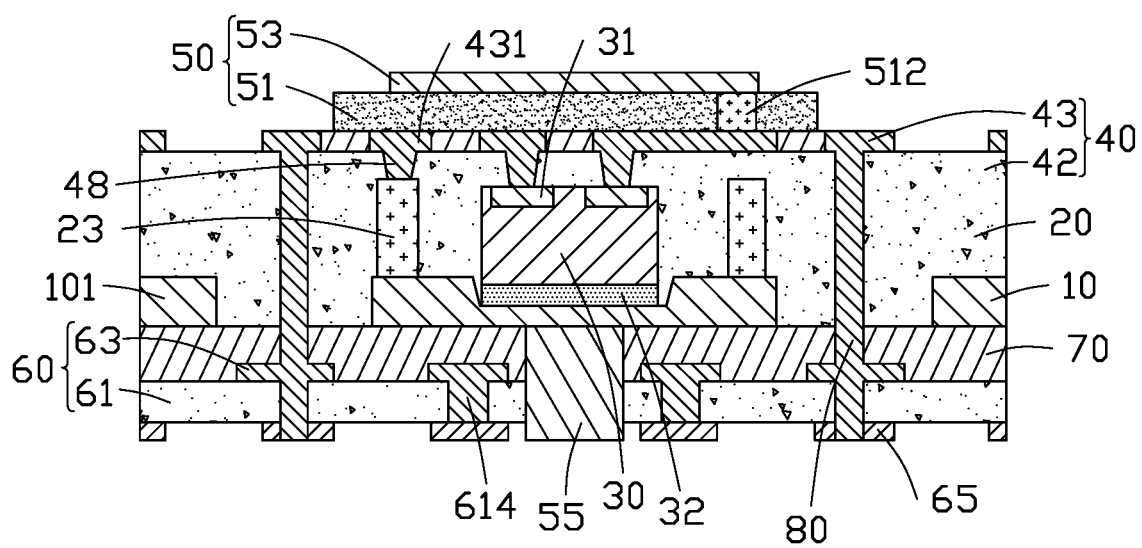
FIG. 15 is a cross-sectional view showing a heat sink formed on the structure shown in FIG. 14.

In step S7, referring to FIG. 15, a blind hole (not shown) is formed on the laminated structure obtained by laminating the antenna structure 50 and the second stacked structure 60 on the structure obtained in step S5. The blind hole is infilled with thermally conductive materials to form a heat sink 55.

The heat sink 55 penetrates the insulation layer 61 of the second stacked structure 60 and one insulating adhesive layer 70 along a thickness direction of the packaged circuit structure 100 and connects to the shielding layer 10, thereby accelerating heat collection from the electronic component 30, for heat dissipation. In one embodiment, the heat sink 55 corresponds in position to the electronic component 30. There can be a number of heat sinks 55, which can be set according to actual needs.

The method for manufacturing a packaged circuit structure further includes defining a plurality of through holes (not shown) on the structure obtained by laminating the antenna structure 50 and the second stacked structure 60 on the structure obtained in step S5; electroplating or infilling the through holes with conductive material to form conductive holes 80, and patterning the second metal layer 62 of the second stacked structure 60 to form the connecting pads 65. The conductive holes 80 electrically connect the first stacked structure 40 and the second stacked structure 60.

In some embodiments, the method further includes step S8.

Figure 16:
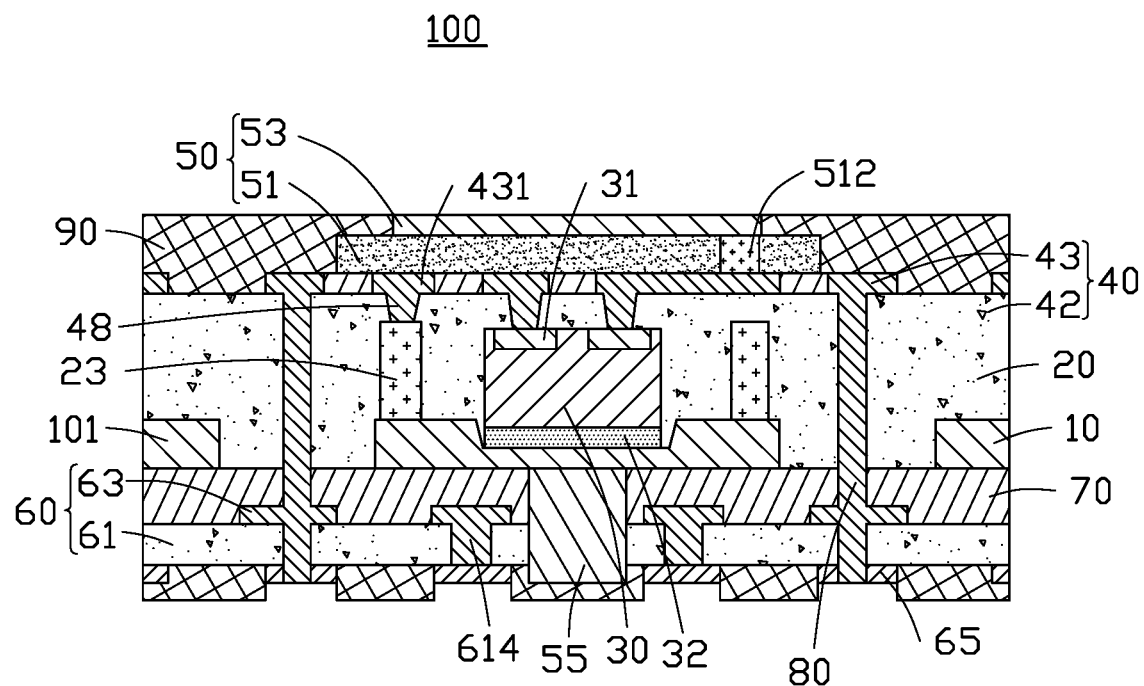
FIG. 16 is a cross-sectional view of an embodiment of a packaged circuit structure.

In step S8, referring to FIG. 16, solder masks 90 are formed on surfaces of the packaged circuit structure 100.

In one embodiment, opposite surfaces of the packaged circuit structure 100 are each provided with a solder mask 90. One solder mask 90 covers the first conductor layer 43 and the dielectric layer 51, and the antenna 53 is exposed outside the solder mask 90. The other solder mask 90 covers the insulation layer 61, and the connecting pads 65 are exposed outside the solder mask 90.

FIG. 16 illustrates an embodiment of a packaged circuit structure 100. The packaged circuit structure 100 includes a shielding layer 10, an electronic component 30, a first insulation layer 20, a first stacked structure 40, an antenna structure 50, and a second stacked structure 60. The shielding layer 10 is provided with a plurality of conductive pillars 23 and defines a groove 12 surrounded by the conductive pillars 23. The electronic component 30 is fixed in the groove 12. The first insulation layer 20 covers the shielding layer 10, the electronic component 30, and the conductive pillars 23. A side of each conductive pillar 23 away from the shielding layer 10 and a side of the electronic component 30 away from the shielding layer 10 are both exposed outside the first insulation layer 20, and a side of the shielding layer 10 away from the electronic component 30 is exposed outside the first insulation layer 20. The first stacked structure 40 is stacked on a side of the first insulation layer 20 and covers the conductive pillars 23 and the electronic component 30. The first stacked structure 40 includes a ground line 431 electrically connecting the conductive pillars 23. The antenna structure 50 is stacked on a side of the first stacked structure 40 away from the first insulation layer 20 and is electrically connected to the electronic component 30 by the first stacked structure 40. The second stacked structure 60 is stacked on a side of the first insulation layer 20 away from the first stacked structure 40, covering the shielding layer 10, and is electrically connected to the first stacked structure 40.

In one embodiment, the electronic component 30 is fixed to a bottom of the groove 12 by a thermally conductive adhesive layer 32. The thermally conductive adhesive layer 32 is completely received in the groove 12 on the shielding layer 10. In other words, the thermal conductive adhesive layer 32 does not protrude from the groove on the shielding layer 10. In one embodiment, a thickness of the thermally conductive adhesive layer 32 is less than a depth of the portion of the groove 12 on the shielding layer 10, and the electronic component 30 is partially received in the portion of the groove 12 on the shielding layer 10, reducing thickness. In other embodiments, the electronic component 30 may be fixed in the groove 12 by other methods.

In one embodiment, the thermally conductive adhesive layer 32 has a good thermal conductivity to accelerate heat collection from the electronic component 30, thereby facilitating heat dissipation.

At least one conductive terminal 31 is formed on a side of the electronic component 30. In one embodiment, the conductive terminal 31 is on a side of the electronic component 30 away from the bottom of the groove 12.

The first stacked structure 40 includes a second insulation layer 42 and a first conductor layer 43 stacked on the second insulation layer 42. The second insulation layer 42 infills the groove 12 and covers the same side of the first insulation layer 20 and the electronic component 30. The second insulation layer 42 is connected to the first insulation layer 20. The first conductor layer 43 is located on a side of the second insulation layer 42 away from the first insulation layer 20 and is electrically connected to the conductive pillars 23 and the electronic component 30. The first conductor layer 43 includes a ground line 431, the ground line 431 is electrically connected to the conductive pillars 23 and forms a structure shielding against electromagnetic interference with the electronic component 30.

The antenna structure 50 corresponds in position to the shielding layer 10 and includes a dielectric layer 51 and an antenna 53 stacked on the dielectric layer 51. The dielectric layer 51 faces the first conductor layer 43. The antenna 53 is located on a side of the dielectric layer 51 away from the first conductor layer 43 and is electrically connected to the first conductor layer 43. The dielectric layer 51 may be, but is not limited to, of materials having a low dielectric constant, such as modified polyimide, liquid crystal polymer, or polyether ether ketone. A first conductive hole 512 is formed on the dielectric layer 51, the first conductive hole 512 penetrates the dielectric layer 51 and electrically connects the antenna 53 and the first conductor layer 43.

The second stacked structure 60 includes an insulation layer 61 and a second conductor layer 63. The second conductor layer 63 faces the shielding layer 10, and the insulation layer 61 is located on a side of the second conductor layer 63 away from the shielding layer 10. In some embodiments, the second conductor layer 63 includes a plurality of connecting pads 65. The connecting pads 65 are located on a side of the insulation layer 61 away from the second conductor layer 63 and allow connection of other electronic elements.

In some embodiments, the antenna structure 50 is fixed to the first stacked structure 40 by an insulating adhesive layer 70, and the second stacked structure 60 is fixed to the first insulation layer 46 by an insulating adhesive layer 70.

In some embodiments, the packaged circuit structure 100 further includes a heat sink 55. The heat sink 55 penetrates the insulation layer 61 of the second stacked structure 60 and one insulating adhesive layer 70 along a thickness direction of the packaged circuit structure 100 and connects to the shielding layer 10. In one embodiment, the heat sink 55 corresponds in position to the electronic component 30. There can be a number of heat sinks 55, which can be set according to actual needs.

In some embodiments, solder masks 90 are formed on surfaces of the packaged circuit structure 100, the connecting pads 65 and the antenna 53 are both exposed outside the solder masks 90.

In the packaged circuit structure 100, the electronic component 30 is fixed in the groove 12 defined on the shielding layer 10, and the shielding layer 10 is provided with grounded conductive pillars 23, shielding against electromagnetic interference and improving temperature stability of the packaged circuit structure 100. Furthermore, the electronic component 30 is fixed in the bottom of the groove 12 by the thermal conductive adhesive layer 32, improving positional accuracy of the electronic component 30. Furthermore, the thickness of the thermal conductive adhesive layer 32 is not more than a depth of the portion of the groove 12 on the shielding layer 10, which reduces overall thickness. In addition, the heat sink 55 enhances heat dissipation efficiency of the packaged circuit structure 100. In the method, the antenna structure 50, the second stacked structure 60, and the electronic component module can all be manufactured separately, improving the processing efficiency.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for manufacturing a packaged circuit structure comprising:
   providing a shielding layer;
   pressing a first insulation layer onto a side of the shielding layer and forming a plurality of conductive pillars, wherein the first insulation layer covers the shielding layer and a side of the shielding layer is exposed outside the first insulation layer, each of the plurality of conductive pillars penetrates the first insulation layer and is electrically connected to the shielding layer;
   defining a groove on the first insulation layer and the shielding layer, wherein the plurality of conductive pillars surround the groove;
   fixing an electronic component in the groove;
   forming a first stacked structure on a same side of the first insulation layer and the electronic component to obtain an electronic component module, the first stacked structure comprising a ground line electrically connecting the plurality of conductive pillars; and
   providing an antenna structure and a second stacked structure, and laminating the antenna structure and the second stacked structure on two opposite surfaces of the electronic component module, the antenna structure being electrically connected to the electronic component by the first stacked structure, the second stacked structure being electrically connected to the first stacked structure.

2. The method of claim 1, wherein after laminating the antenna structure and the second stacked structure on two opposite surfaces of the electronic component module, the method further comprises:
   defining a blind hole on the laminated structure, the blind hole penetrating the second stacked structure, the shielding layer being exposed in the blind hole;
   infilling the blind hole with thermal conductive materials to form a heat sink, the heat sink connecting a side of the shielding layer away from the groove.

3. The method of claim 1, wherein the step of forming a first stacked structure on a same side of the first insulation layer and the electronic component comprises:
   providing a copper clad laminate comprising a second insulation layer and a copper layer stacked on the second insulation layer;
   pressing the copper clad laminate onto a same side of the first insulation layer and the electronic component, the second insulation layer infilling the groove and connecting the first insulation layer, so that the electronic component is embedded into the first insulation layer and the second insulation layer; and
   patterning the copper layer to form the first conductor layer.

4. The method of claim 1, wherein the electronic component is fixed to a bottom of the groove by a thermal conductive adhesive layer, a thickness of the thermal conductive adhesive layer is not more than a depth of the groove on the shielding layer.

5. The method of claim 1, wherein a thickness of the electronic component is not more than a depth of the groove.

6. The method of claim 1, wherein the step of providing an antenna structure and a second stacked structure, and laminating the antenna structure and the second stacked structure on two opposite surfaces of the electronic component module comprises:
   laminating a dielectric layer on a first metal layer and forming a first conductive hole on the dielectric layer, the first conductive hole electrically connecting the first metal layer, thereby obtaining the antenna structure;
   laminating an insulation layer on a second metal layer, forming a second conductive hole on the second metal layer, and forming a second conductor layer on a side of the insulation layer away from the second metal layer, the second conductive hole electrically connecting the second metal layer, thereby obtaining the second stacked structure;

laminating the antenna structure and the second stacked structure onto the first stacked structure and the first insulation layer respectively, wherein the dielectric layer faces the first stacked structure, the first conductive hole is electrically connected to the first stacked structure, the second conductor layer faces the first insulation layer and covers the shielding layer.

7. The method of claim 1, wherein at least one conductive terminal is formed on a side of the electronic component away from a bottom of the groove, each of the at least one conductive terminal is electrically connected to the antenna structure by the first stacked structure.

\* \* \* \* \*